(12) United States Patent
Ji et al.

(10) Patent No.: US 9,991,416 B2
(45) Date of Patent: Jun. 5, 2018

(54) METHOD FOR MANUFACTURING LIGHT EMITTING DIODE WITH INGAN/GAN SUPERLATTICE

(71) Applicant: INDUSTRY FOUNDATION OF CHONNAM NATIONAL UNIVERSITY, Gwangju (KR)

(72) Inventors: Taeksoo Ji, Seoul (KR); Jinyoung Park, Gwangju (KR); Jinhong Lee, Gwangju (KR); Wangki Kim, Gwangju (KR); Jaesam Shim, Gwangju (KR); Kwangjae Lee, Gwangju (KR)

(73) Assignee: INDUSTRY FOUNDATION OF CHONNAM NATIONAL UNIVERSITY, Gwangju (KR)

( * ) Notice: Subject to any disclaimer, the term of this patent is extended or adjusted under 35 U.S.C. 154(b) by 0 days. days.

(21) Appl. No.: 15/632,127

(22) Filed: Jun. 23, 2017

(65) Prior Publication Data

US 2017/0294556 A1 Oct. 12, 2017

Related U.S. Application Data

(62) Division of application No. 15/066,906, filed on Mar. 10, 2016, now abandoned.

(30) Foreign Application Priority Data

Jul. 24, 2015 (KR) .................. 10-2015-0104731

(51) Int. Cl.
*H01L 33/04* (2010.01)
*H01L 33/06* (2010.01)
(Continued)

(52) U.S. Cl.
CPC .......... *H01L 33/04* (2013.01); *H01L 21/0251* (2013.01); *H01L 21/02507* (2013.01);
(Continued)

(58) Field of Classification Search
CPC ..... H01L 33/04; H01L 33/12; H01L 33/0075; H01L 21/02507; H01L 21/0254; H01L 21/0251
See application file for complete search history.

(56) References Cited

U.S. PATENT DOCUMENTS

7,193,246 B1 * 3/2007 Tanizawa ............... B82Y 20/00
257/101
2009/0072262 A1 3/2009 Iza et al.
(Continued)

*Primary Examiner* — Daniel Luke
(74) *Attorney, Agent, or Firm* — Knobbe Martens Olson & Bear LLP (57) ABSTRACT

A light emitting diode and a method of manufacturing the light emitting diode are provided. The light emitting diode includes an n-type semiconductor layer, an inclined type superlattice thin film layer, an active layer, and a p-type semiconductor layer. The n-type semiconductor layer is disposed on a substrate. The inclined type superlattice thin film layer is disposed on the n-type semiconductor layer and includes a plurality of thin film pairs in which InGaN thin films and GaN thin films are sequentially stacked. The active layer having a quantum well structure is disposed on the inclined type superlattice thin film layer. The p-type semiconductor layer is disposed on the active layer. Composition ratio of Indium (In) included in the InGaN thin film is increased as getting closer to the active layer. Thus, internal residual strain is reduced, and quantum confinement effect is enhanced, and internal quantum efficiency is increased.

8 Claims, 10 Drawing Sheets

(51) Int. Cl.
*H01L 33/00* (2010.01)
*H01L 33/32* (2010.01)
*H01L 21/02* (2006.01)

(52) U.S. Cl.
CPC ........ *H01L 33/007* (2013.01); *H01L 33/0025* (2013.01); *H01L 33/06* (2013.01); *H01L 33/32* (2013.01)

(56) References Cited

U.S. PATENT DOCUMENTS

| | | | |
|---|---|---|---|
| 2012/0049155 A1 | 3/2012 | Tachibana et al. | |
| 2012/0056156 A1* | 3/2012 | Kikuchi | H01L 33/04 257/13 |
| 2013/0168638 A1* | 7/2013 | Park | H01L 33/04 257/13 |
| 2015/0243840 A1* | 8/2015 | Johnston | H01L 33/12 257/13 |

* cited by examiner

METHOD FOR MANUFACTURING LIGHT EMITTING DIODE WITH INGAN/GAN SUPERLATTICE

STATEMENT REGARDING R&D SUPPORTED BY KOREAN GOVERNMENT

This research was supported by the MSIP (Ministry of Science, ICT and Future Planning) Korea, under the ITRC (Information Technology Research Center) support program (IITP-2017-2016-0-00314) supervised by the IITP (Institute for Information & communications Technology Promotion).

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

1. Field

The present disclosure relates to a light emitting diode, and more specifically, to a light emitting diode including an inclined type superlattice thin film layer and a method of manufacturing the same.

2. Discussion of Related Art

A light emitting diode (LED) is a semiconductor light emitting unit formed by a bonding structure of an n-type semiconductor layer and a p-type semiconductor layer including compound semiconductor material. Generally, the light emitting diode is a kind of an optoelectronic device configured to emit energy corresponding to a band gap between a conduction band and a valance band in a form of light by recombination of electrons from the n-type semiconductor layer and holes from the p-type semiconductor layer when a forward voltage is applied. Such a light emitting diode has advantages in terms of an excellent energy efficiency, color uniformity, long lifetime, or the like and thus may not only be applied as a main light source of a head lamp of an automobile, an illumination device, and a display, but also becoming broadly applied in skin care and the medical area recently.

The light emitting diode is mainly manufactured of nitride-based compound semiconductor material of group such as AlN, GaN, InN, or the like. Since the nitride-based compound semiconductors have wide band gaps in a range of about 0.7 eV to about 6.2 eV, various wavelengths are realized by adjusting composition of the compound. Also, as a direct transition type semiconductor, the nitride-based compound semiconductor has rapid response speed, high electron mobility, and high thermal and chemical stability, is capable of being operated at a high temperature, and thus, is widely used in the fields of optoelectronic device with high luminance and large output electric device.

Generally, in order to realize various wavelengths in the light emitting diode, composition ratio of indium (In) in the nitride-based compound is varied to control the wavelength, but when the composition ratio of the indium (In) is increased, indium (In) segregation phenomenon, internal defects due to a lattice mismatch, or the like are generated, and thus, light output efficiency of the light emitting diode is rapidly decreased. In particular, the above problem is more severe in a long wavelength (green wavelength), and the above phenomenon is referred to as a green gap.

Also, a strong compressive strain is generated by a large difference of lattice constant between InGaN and GaN, band-bending of energy is generated, recombination of carriers, that is, injected electrons and holes, is not made, and thus the carriers don't contribute to light emission. Thus, efforts for an increase of light output efficiency and improvement of internal quantum efficiency for the long wavelength are needed.

Recently, in order to solve the above problem, a technology for manufacturing a green light emitting diode of large output using a nonpolar or semipolar substrate and a technology for changing a structure of a quantum well to control defects and internal residual strain are being developed, but the above green gap problem still remains as a problem in manufacturing a high efficiency light emitting diode.

SUMMARY

The present disclosure is directed to a light emitting diode capable of reducing internal residual strain of a light emitting diode, decreasing defects and enhancing confinement effect of carriers to increase internal quantum efficiency and a method of manufacturing the same.

According to an aspect of the present invention, there is provided a light emitting diode. The light emitting diode includes an n-type semiconductor layer, an inclined type superlattice thin film layer, an active layer, and a p-type semiconductor layer. The n-type semiconductor layer is disposed on a substrate. The inclined type superlattice thin film layer is disposed on the n-type semiconductor layer, and includes a plurality of thin film pairs in which InGaN thin films and GaN thin films are sequentially stacked. The active layer having a quantum well structure is disposed on the inclined type superlattice thin film layer. The p-type semiconductor layer is disposed on the active layer. Composition ratio of Indium (In) included in the InGaN thin film is increased as getting closer to the active layer.

The inclined type superlattice thin film layer may have a structure in which the thin film pairs of 2 to 100 are disposed.

The inclined type superlattice thin film layer may reduce band bending generated by a lattice mismatch in the quantum well structure of the active layer, and the n-type semiconductor layer and the p-type semiconductor layer may include an n-type GaN layer and a p-type GaN layer, respectively.

The light emitting diode may further include a GaN layer interposed between the inclined type superlattice thin film layer and the active layer.

According to another aspect of the present invention, there is provided a method of manufacturing a light emitting diode. The method includes forming an n-type semiconductor layer on a substrate, forming an inclined type superlattice thin film layer including a plurality of thin film pairs in which InGaN thin films and GaN thin films are sequentially stacked on the n-type semiconductor layer, forming an active layer having a quantum well structure on the inclined type superlattice thin film layer, and forming a p-type semiconductor layer on the active layer. Composition ratio of Indium (In) included in the InGaN thin film is increased as getting closer to the active layer.

Forming of the inclined type superlattice thin film layer may include a first step of forming the InGaN thin film, and a second step of removing indium included in an upper portion of the InGaN thin film to form the thin film pairs in which the InGaN thin films and the GaN thin films are sequentially stacked. The first step and the second step may be alternately performed repeatedly in a plurality of times.

The first step may be performed under nitrogen atmosphere using a metal organic chemical vapor deposition (MOCVD) method.

The second step may include supplying hydrogen ($H_2$) on an upper portion of the InGaN thin film and removing indium (In) included in the upper portion of the InGaN thin film, and the hydrogen may be supplied for 25 seconds to 30 seconds at a speed in a range of 8,000 sccm to 8,500 sccm.

The inclined type superlattice thin film layer may be formed by alternating performing the first steps and the second steps repeatedly 2 to 100 times, and after the first steps and the second steps are alternately performed, the steps may be performed at a temperature lower than the temperature of previous steps during the repeatedly performing the first step and the second step. In particular, during repeatedly performing of the first step and the second step, the steps may be performed at a temperature lower than the temperature of previous steps by about 5° C.

Before forming of the active layer of the quantum well structure on the inclined type superlattice thin film layer, the method may further include forming a GaN layer on the inclined type superlattice thin film layer.

BRIEF DESCRIPTION OF THE DRAWINGS

The above and other subjects, features, and advantages of the present invention will become more apparent to those of ordinary skill in the art by describing in detail embodiments thereof with reference to the accompanying drawings, in which.

DETAILED DESCRIPTION OF EMBODIMENTS

Hereinafter, embodiments of the present invention will be described in detail below with reference to the accompanying drawings.

The present invention is not limited to the embodiments and the accompanying drawings disclosed and is only defined by the scope of the appended claims. Accordingly, it will be apparent to those skilled in the art that various modifications, equivalents, and alternatives can be made to the described embodiments of the present invention without departing from the spirit or scope of the invention, and it is intended that the present invention is to cover all such modifications, equivalents, and alternatives. The same reference numbers will be used throughout this specification to refer to the same or like components.

Method of Manufacturing Light Emitting Diode Including Inclined Type Superlattice Thin Film Layer According to one aspect of the present invention, a method of manufacturing a light emitting diode is provided. In particular, the method of manufacturing the light emitting diode includes 1) forming an n-type semiconductor layer on a substrate, 2) forming an inclined type superlattice thin film layer with a structure having a plurality of thin film pairs in which an InGaN thin film and a GaN thin film are sequentially stacked on the n-type semiconductor layer, 3) forming an active layer of a quantum well structure on the inclined type superlattice thin film layer, and 4) forming a p-type semiconductor layer on the active layer. Here, composition ratio of indium (In) included in the InGaN thin film may increase as getting closer to the active layer.

FIGS. 1A to 1D are schematic diagrams illustrating a method of manufacturing a light emitting diode according to one embodiment of the present invention.

Figure 1A:
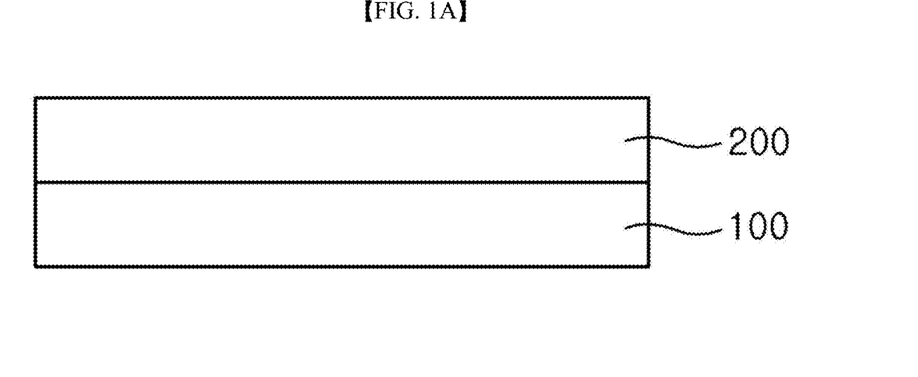
FIGS. 1A to 1D are schematic diagrams illustrating a method of manufacturing a light emitting diode according to one embodiment of the present invention.

Referring to FIG. 1A, the method of manufacturing the light emitting diode of the embodiment of the present invention may include 1) forming an n-type semiconductor layer 200 on a substrate 100.

The substrate 100 may have a predetermined light transmittance and may be a material which may facilitate growing of the n-type semiconductor layer 200. In particular, the substrate 100 may formed of at least one material selected from sapphire ($Al_2O_3$), Si, SiC, glass, quartz, ceramic, Ge, GaAs, GaP, InP, InAs, GaN, and AlN. For example, when the light emitting diode includes a nitride-based compound semiconductor and has a structure of a hexagonal lattice, the substrate 100 may be formed of a material also having a structure of a hexagonal lattice. In the embodiment of the present invention, the substrate 100 may be formed of sapphire.

In the embodiment of the present invention, before the n-type semiconductor layer 200 is formed on the substrate 100, a buffer layer (not shown) may be formed on the substrate 100. Generally, the buffer layer is formed in order to reduce the lattice mismatch of a substrate and may be formed on the entire surface of the substrate. The buffer layer may generally use any one material selected from SiC, ZnO, Si, GaAs, AlN, and GaN which are generally not doped by dopants but is not limited by the above.

The n-type semiconductor layer 200 represents a semiconductor layer doped with n-type dopants, and the n-type dopants may be silicon (Si). In particular, for example, the n-type semiconductor layer 200 may include nitride-based compound semiconductor layer having any one material selected from GaN and $Al_xGa_{(1-x)}N(0 \leq x \leq 1)$. In the embodiment of the present invention, the n-type semiconductor layer 200 may include an n-GaN layer.

The n-type semiconductor layer 200 may be formed on the substrate 100 through methods of metal organic chemical vapor deposition (MOCVD), hydride vapor phase epitaxy (HVPE), molecular beam epitaxy (MBE), e-beam deposition, sputtering, or the like, but is not limited by the above methods.

Figure 1B:
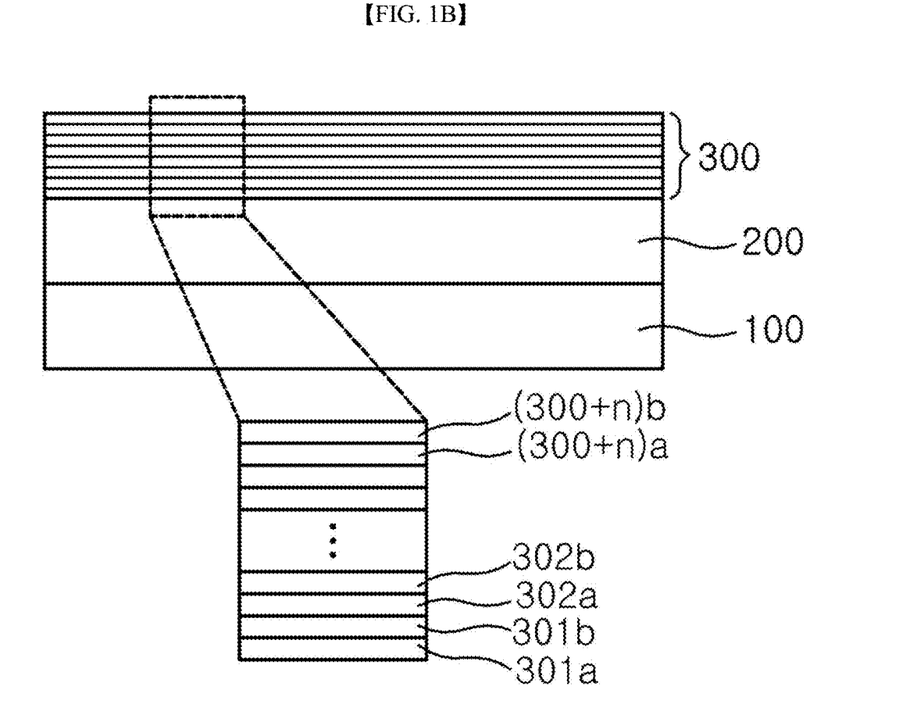

Referring to FIG. 1B, the method of manufacturing the light emitting diode of the embodiment of the present invention may include 2) forming a superlattice thin film layer 300 on the n-type semiconductor layer 200. The inclined type superlattice thin film layer 300 may have a structure including a plurality of thin film pairs in which InGaN thin films 301a, 302a, . . . (300+n)a and GaN thin films 302b, (300+n)b are sequentially stacked. Unlike a conventional superlattice thin film layer, the inclined type superlattice thin film layer may have a sloped indium (In) concentration gradient in which composition ratio of indium (In) in the inclined type superlattice thin film layer increases as getting closer to the active layer. The n represents the number of the thin film pairs and may be an integer in a range of 2 to 100. The inclined type superlattice thin film layer according to the embodiment of the present invention and the effect thereof may be realized when the number of the thin film pairs is in the plural, that is, more than one pair, thus the number of the thin film pairs must be at least two. Also, when the number of the thin film pairs is more than 100, the total thickness of the inclined type superlattice thin film layer is too thick, and the distance that electrons injected into the light emitting diode move may become large. That is, when the thickness of the inclined type superlattice thin film layer is thick, resistance may be increased and dispersion of electrons and loss caused by defects may occur, and thus, the number of the thin film pairs may be less than 100. In the embodiment of the present invention, the n may be 12.

In particular, the formation of the inclined type superlattice thin film layer 300 includes a first step of forming the InGaN thin film and a second step of removing indium (In) included in an upper portion of the InGaN thin film to form a thin film pair in which the InGaN thin film and the GaN thin film are sequentially stacked, and the first step and the second step may be alternately performed repeatedly a plurality of times.

In particular, the first step of forming the InGaN thin film may be performed using MOCVD under nitrogen atmosphere ($NH_3$ or $N_2$). Also, hydrogen ($H_2$) may be supplied onto the upper portion of the InGaN thin film so that indium (In) included in the upper portion of the InGaN thin film is removed. In particular, the hydrogen ($H_2$) may be supplied onto the upper portion of the InGaN thin film for about 25 seconds to about 30 seconds at a speed of about 8,000 sccm to about 8,500 sccm.

Figure 2:
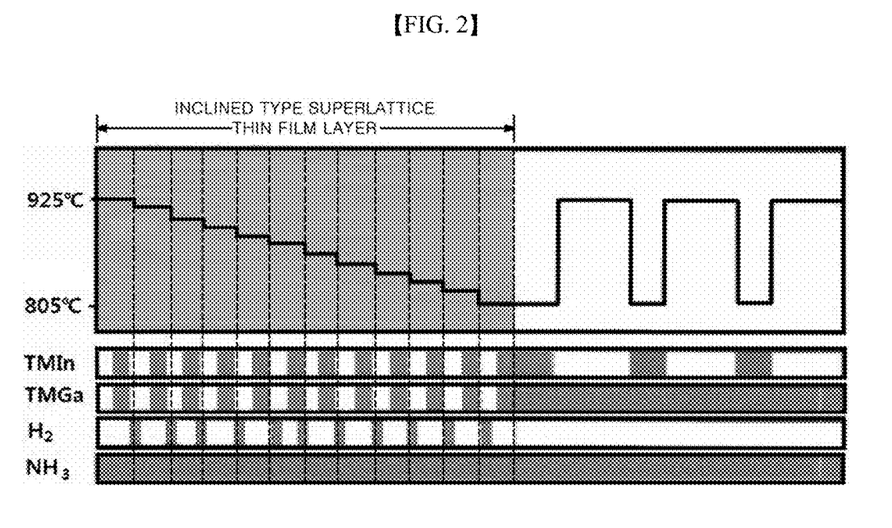
FIG. 2 is a schematic diagram illustrating a method of manufacturing an inclined type superlattice thin film layer according to one embodiment of the present invention.

FIG. 2 is a schematic diagram illustrating a method of manufacturing an inclined type superlattice thin film layer according to one embodiment of the present invention.

Referring to FIG. 2, trimethylgallium (TMG), trimethylindium (TMI) and a nitrogen based gas ($NH_3$ or $N_2$) are supplied onto a substrate 100 on which the n-type semiconductor layer 200 is formed and which is disposed in an MOCVD apparatus to form an InGaN thin film. Then, hydrogen gas may be supplied to the device, and indium (In) included in the upper portion of the InGaN thin film may be removed. In the embodiment of the present invention, the hydrogen ($H_2$) may be supplied for about 25 seconds to about 30 seconds at a speed of about 8,000 sccm to about 8,500 sccm. Indium (In) included in the upper portion of the InGaN thin film is removed, and thus InGaN thin film may become the GaN film. Thus, the thin film pair in which the InGaN thin film and the GaN thin film are sequentially stacked may be formed.

Since the above-described first step and the second step may be alternately performed repeatedly a plurality of times, the inclined type superlattice thin film layer 300 may have the structure including a plurality of thin film pairs in which the InGaN thin film and the GaN thin film are sequentially stacked. In the embodiment of the present invention, the inclined type superlattice thin film layer 300 may be formed by alternately performing each of the first step and second step of forming the thin film pairs repeatedly two to twelve times. Thus, the inclined type superlattice thin film layer 300 may have a structure of 2 to 100 pairs of the thin film pairs in which the InGaN thin films and the GaN thin films sequentially stacked.

Also, after the first step and the second step are alternately performed, the first step and the second step may be repeatedly performed at a temperature lower than that of the previously performed steps. In particular, in the embodiment of the present invention, when the first step and the second step are repeatedly performed, the first step and the second step may be performed at a temperature lower than the previously performed steps by 5° C.

Referring to FIG. 2, the first step and the second step may be firstly performed at about 925° C., and then, the first step and the second step may be secondly performed at a temperature lower than the temperature of about 925° C. Then, the first step and the second step may be thirdly performed at a temperature lower than the temperature of the second performance. By the above method, when the first step and the second step are alternately performed repeatedly, the first step and the second step may be performed at a temperature lower than the temperature of the previous steps. As the temperature is lower, indium (In) composition is increased, and thus as the number of repeated alternating performance of the first step and the second step is increased, an InGaN thin film in which the composition ration of indium (In) in the InGaN thin film formed in the first step is increased may be formed. That is, the composition ratio of indium (In) of a second InGaN thin film formed by the second performance may be greater than that of a first InGaN thin film formed by the first performance, and the composition ratio of indium (In) of a third InGaN thin film formed by the third performance may be greater than that of the second InGaN thin film.

As described above, when the plurality of thin film pairs in which InGaN thin films and GaN thin films of the embodiment of the present invention are sequentially stacked are formed, by lowering the temperature of the performance than that of the previous performance as the number of performances increases, the composition ratio of indium (In) included in the InGaN thin film is increased as getting closer to the active layer to form the InGaN thin film, thereby forming the inclined type superlattice thin film layer having the sloped indium (In) concentration gradient.

Figure 1C:
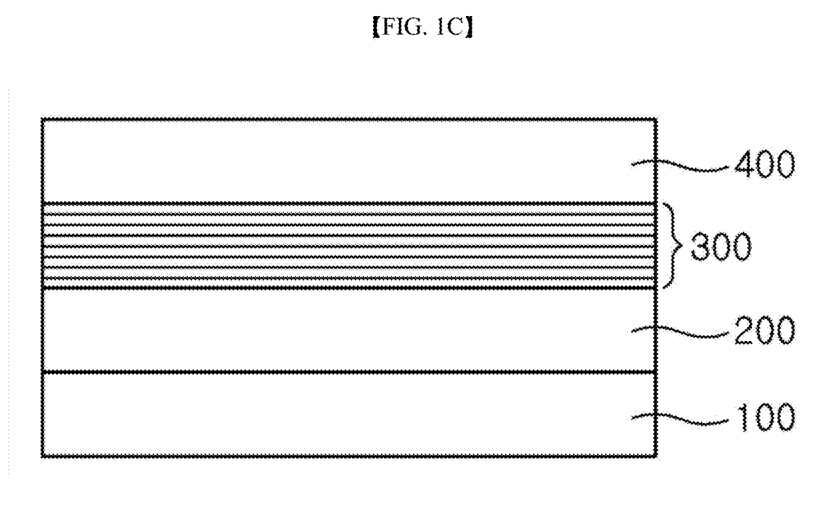

Referring to FIG. 1C, the method of manufacturing the light emitting diode of the embodiment of the present invention may include 3) forming an active layer 400 having a quantum well structure on the inclined type superlattice thin film layer 300.

The active layer 400 of the quantum well structure is disposed between the n-type semiconductor layer 200 and subsequent p-type semiconductor layer 500 and is a light emitting layer configured to emit light due to recombination of injected electrons and holes. The active layer 400 may have a single quantum well structure or a multi quantum well (MQW) structure, and according to the embodiment of the present invention, the MQW structure may be applied. Generally, the active layer 400 of the MQW structure represents a structure in which a barrier layer and a well layer are alternately stacked, and the barrier layer has a bandgap higher than that of the well layer, and thus, quantum confinement effect may be effectively realized in the well layer. In the embodiment of the present invention, five well layers are used, but the present invention is not limited by the above and more well layers may be used according to embodiments of the present invention.

When the light emitting diode is formed of a nitride-based compound semiconductor, the active layer 400 may be formed based on GaN. In particular, material having a bandgap lower than that of GaN is introduced into the active layer 400, and a bandgap of the well layer may be adjusted. That is, the active layer 400 of the MQW structure includes an InGaN layer of $In_xAl_yGa_{(1-x-y)}N(0 \leq x \leq 1, 0 \leq y < 1,$ and $0 \leq x+y < 1)$ as the well layer and a GaN layer as the barrier layer.

The formation of the active layer 400 on the inclined type superlattice thin film layer 300 may be performed through a conventional manufacturing method and for example, may be formed through MOCVD method, HVPE method, MBE method, e-beam deposition, sputtering, or the like, but is not limited by the above.

Figure 1D:
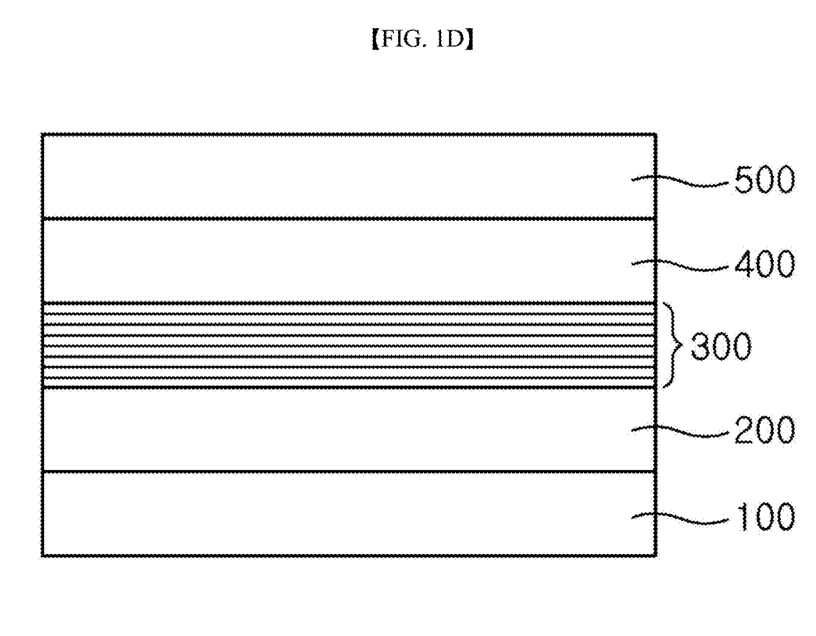

Referring to FIG. 1D, the method of manufacturing the light emitting diode of the embodiment of the present invention may include 4) forming a p-type semiconductor layer 500 on the active layer 400.

The p-type semiconductor layer 500 represents a semiconductor layer doped with p-type dopants, and the p-type dopants may include any one material selected from magnesium (Mg), zinc (Zn), calcium (Ca), strontium (Sr), and barium (Ba). In particular, for example, the p-type semiconductor layer 500 may include a nitride-based compound semiconductor including any one material selected from GaN or $Al_xGa_{(1-x)}N(0 \leq x < 1)$. In the embodiment of the present invention, the p-type semiconductor layer 500 may include a p-GaN layer. The formation of the p-type semiconductor layer 500 on the active layer 400 may be performed through a conventional method, and the above-described methods of forming the n-type semiconductor layer 200 and the active layer 400 may be used.

Figure 3A:
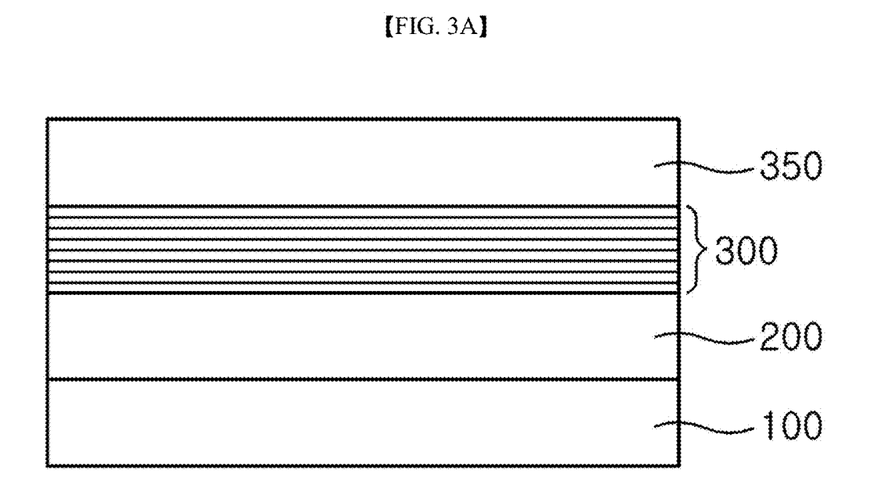
FIGS. 3A and 3B are schematic diagrams illustrating a method of manufacturing a light emitting diode according to another embodiment of the present invention.
Figure 3B:
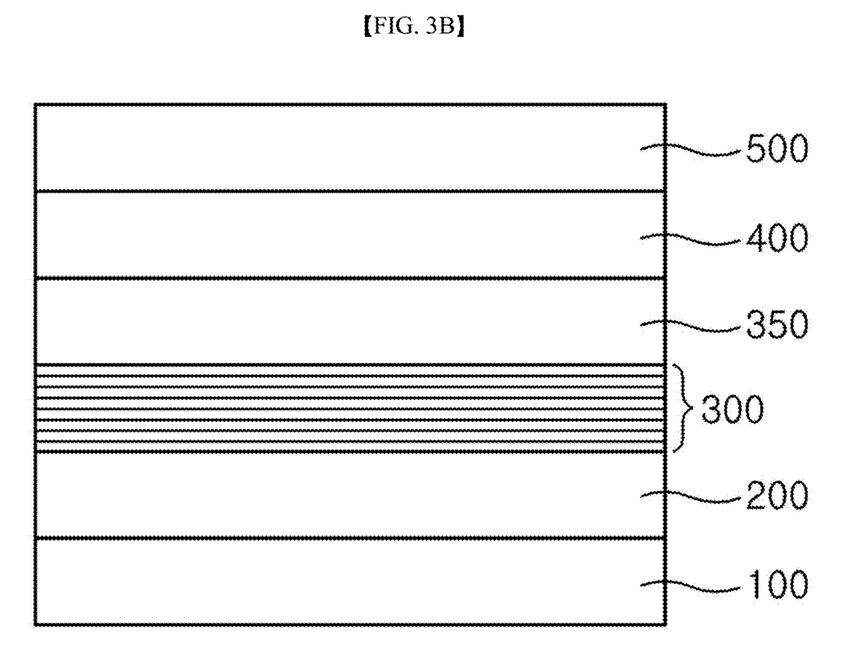

FIGS. 3A and 3B are schematic diagrams illustrating a method of manufacturing a light emitting diode according to another embodiment of the present invention.

Referring to FIG. 3A, before forming the active layer 400 of the quantum well structure on the inclined type superlattice thin film layer 300, a GaN layer 350 may further be formed on the inclined type superlattice thin film layer 300. The GaN layer 350 may function as a cap layer to prevent damage of the inclined type superlattice thin film layer 300 by a process in which temperatures increase during the formation of the active layer 400 on the inclined type superlattice thin film layer 300. The GaN layer 350 may be formed through the above-described method of manufacturing the semiconductor layer. Then, as shown in FIG. 3B, the active layer 400 and the p-type semiconductor layer 500 may be sequentially formed on the GaN layer 350.

As described above, the method of manufacturing the light emitting diode of the embodiment of the present invention easily forms the inclined type superlattice thin film layer including the structure having the plurality of thin film pairs in which the InGaN thin films and the GaN thin films are alternately stacked by a temperature control and hydrogen supply, and thus, manufacturing efficiency of the high efficiency light emitting diode having reduced residual strain and increased internal quantum efficiency may be improved. Also, the method of manufacturing the light emitting diode of the embodiment of the present may be performed using a conventional method of growing the light emitting diode and equipment thereof, and thus, the above method may be effectively used in related industries without additional cost. In particular, the growth temperature and the gas used in the process of forming the inclined type superlattice thin film layer of the embodiment of the present invention are similar to those for materials for thin films of a conventional light emitting diode, and thus, the technology may have an excellent adaptability.

Light Emitting Diode Including Inclined Type Superlattice Thin Film Layer

According to another aspect of the present invention, a light emitting diode including an inclined type superlattice thin film layer may be provided. The light emitting diode may be manufactured by the above-described method of manufacturing the light emitting diode including the inclined type superlattice thin film layer. In particular, the light emitting diode may include an n-type semiconductor layer disposed on a substrate, an inclined type superlattice thin film layer disposed on the n-type semiconductor layer and having a structure including a plurality of thin film pairs in which InGaN thin films and GaN thin films are sequentially stacked, an active layer having a quantum well structure disposed on the inclined type superlattice thin film layer, and a p-type semiconductor layer disposed on the active layer. Here, the composition ratio of indium (In) included in the InGaN thin film of the inclined type superlattice thin film layer is increased as getting closer to the active layer.

The light emitting diode is manufactured by the above-described method of manufacturing the light emitting diode including the inclined type superlattice thin film layer, and thus, the light emitting diode may be the same as described in the method of manufacturing the light emitting diode including the inclined type superlattice thin film layer. Thus, the light emitting diode of the embodiment of the present invention is described using the description of the method of manufacturing the light emitting diode including the inclined type superlattice thin film layer, and thus, a detailed description will be omitted, and hereinafter, particular structures of the light emitting diode will be described.

Figure 4A:
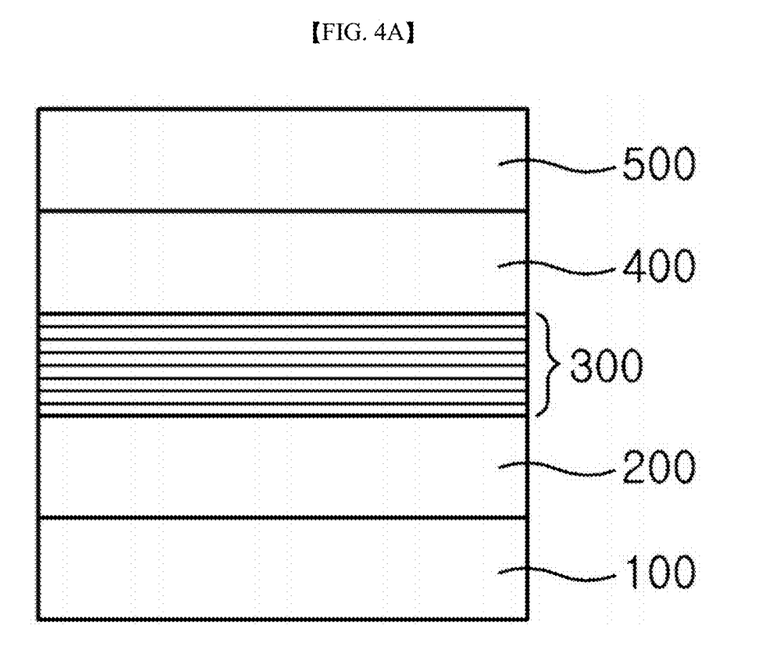
FIGS. 4A and 4B are a schematic diagram illustrating a structure of a light emitting diode according to one embodiment of the present invention and an image of a light emitting diode manufactured by Embodiment 1 observed using a transmission electron microscope (TEM)
Figure 4B:
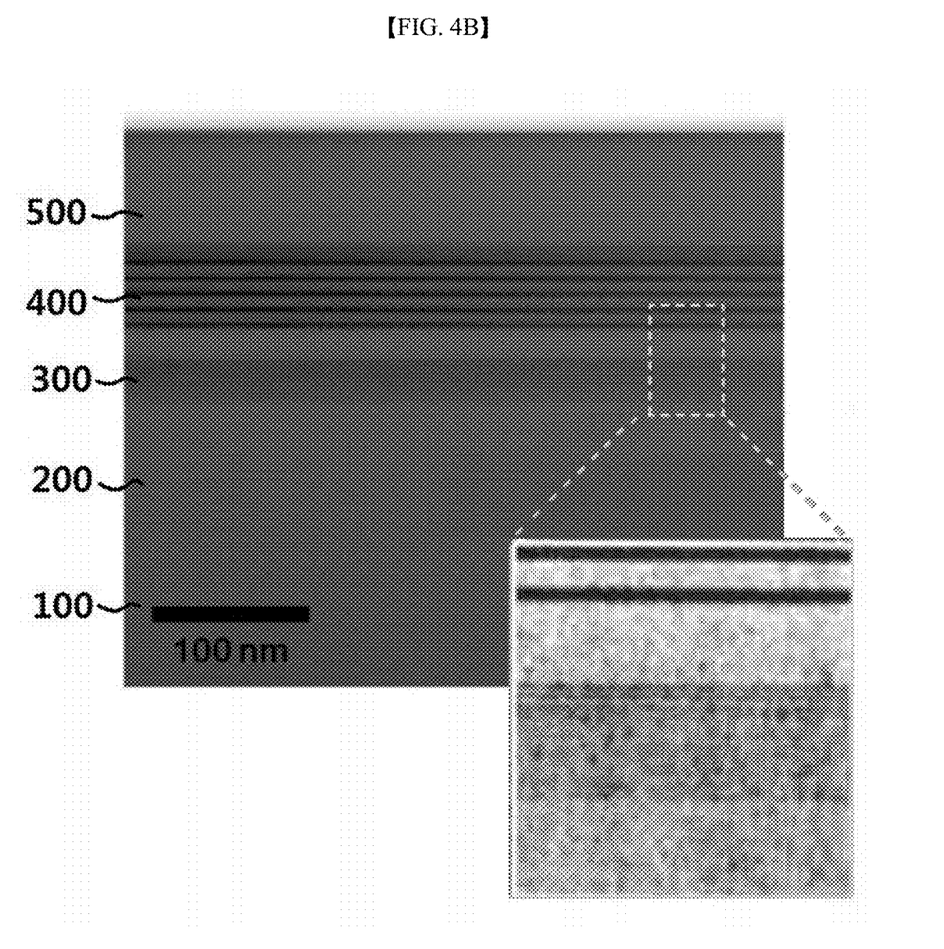

FIGS. 4A and 4B are a schematic diagram illustrating a structure of a light emitting diode according to one embodiment of the present invention and an image of a light emitting diode manufactured according to Embodiment 1 observed using a transmission electron microscope (TEM).

Referring to FIG. 4A, the light emitting diode of the embodiment of the present invention includes an n-type semiconductor layer 200 on a substrate 100, and an inclined type superlattice thin film layer 300 including a plurality of thin film pairs in which InGaN thin films and GaN thin films are sequentially stacked on the n-type semiconductor layer 200. An active layer 400 of a quantum well structure and a p-type semiconductor layer 500 may be sequentially disposed on the inclined type superlattice thin film layer 300. The n-type semiconductor layer 200 and the p-type semiconductor layer 500 may include an n-type GaN layer and a p-type GaN layer, respectively.

FIG. 4B is a TEM image illustrating the structure of the light emitting diode manufactured by Embodiment 1 of the present invention, and an inclined type superlattice thin film layer superbly formed in which twelve thin film pairs are stacked between the n-GaN layer and the multi quantum well structure can be seen.

In the embodiment of the present invention, the inclined type superlattice thin film layer 300 may have a structure in which thin film pairs of 2 to 100 are disposed. Also, composition ratio of indium (In) included in the InGaN thin film is increased as getting closer to the active layer.

As described above, the light emitting diode of the embodiment of the present invention includes the inclined type superlattice thin film layer 300 under the active layer 400, and band bending generated by the lattice mismatch in a quantum well structure of the active layer 400 may be decreased. Thus, the light emitting diode of the embodiment of the present invention may reduce internal residual strain in the light emitting diode and also reduce defects and enhance confinement effect of carriers, and thus, increasing internal quantum efficiency. Thus, as a result, light output of the light emitting diode may be improved, and the light emitting diode of the embodiment of the present invention may be applied to all light emitting diodes, and in particular, when the light emitting diode is applied to a green light emitting diode having extremely low internal quantum efficiency, the effect may be increased. In particular, the above may be described by the following embodiments and drawings in detail.

In the embodiment of the present invention, a GaN layer may further be formed between the inclined type superlattice thin film layer 300 and the active layer 400. The GaN layer may function as a cap layer to prevent damage of the inclined type superlattice thin film layer 300.

Hereinafter, embodiments are described for an understanding of the present invention, but the following embodiments are only examples of the present invention, and the scope of the present invention will not be limited by the following embodiments.

EMBODIMENTS

Embodiment 1: Manufacturing Light Emitting Diode Including Inclined Type Superlattice Thin Film Layer An n-Gan layer was formed on a sapphire substrate using MOCVD apparatus. Then, at a temperature of 925° C., 100 sccm of trimethylgallium (TMG), 270 sccm trimethylindium (TMI), and 28,000 sccm of ammonia gas ($NH_3$) were supplied to the apparatus for about 55 seconds to form an InGaN thin film of 2 nm thickness. Then, approximately 10% hydrogen gas in a nitrogen gas atmosphere was flowed into the apparatus for about 25 seconds at a speed of 8,400 sccm to remove indium included in an upper portion of the InGaN thin film. Then, indium included in the upper portion of about 0.8 nm to about 1.0 nm of the InGaN thin film formed at a thickness of about 2 nm was removed to form a GaN thin film. Forming the above-described InGaN thin films and the GaN thin films were alternately performed 11 times to form an inclined type superlattice thin film layer having a thickness of 24 nm in which 12 thin film pairs including the InGaN thin films and the GaN thin films having a thickness of 1 mm are disposed. During the 11 times repeated steps, a temperature of the device, as shown in FIG. 2, was decreased by 5° C. per each step. Then, an active layer of a multi quantum well structure including five quantum well layers and a p-GaN layer were sequentially formed on the inclined type superlattice thin film layer.

Comparative Embodiment 1: Light Emitting Diode without Inclined Type Superlattice Thin Film Layer A light emitting diode was manufactured in the same process as described in Embodiment 1 except for forming the inclined type superlattice thin film layer.

Comparative Embodiment 2: Light Emitting Diode Including CART Structure Layer

A light emitting diode was manufactured in the same process as described in Embodiment 1 except that a conventional CART structure layer was formed instead of the inclined type superlattice thin film layer.

Generally, a conventional charge asymmetric resonance tunneling (CART) structure includes an InGaN layer of tens of nanometers which is inserted between an n-GaN layer and an active layer in order to increase efficiency of a light emitting diode. Generally, indium composition of an InGaN layer of the CART structure may be smaller than that of InGaN in the active layer (Characteristics and effect of the CART structure are described in "IEEE Trans. Elec. Dev. 49, 1093, (2002)").

Comparative Embodiment 3: Light Emitting Diode Including Superlattice Layer

A light emitting diode was manufactured in the same process as described in Embodiment 1 except that an n/p-[AlGaN/GaN] superlattice layer was formed under the active layer using conventional Si and Mg doping materials instead of the inclined type superlattice thin film layer was formed (The method of manufacturing the superlattice layer is described in "Light Emitting Diodes (LEDs) for Generating Illumination," OIDA Technology Road Map Update 2002, 2002 and Manning Fan et al., "Color Filter-less Technology of LED Back Light for LCD-TV," Proc. SPIE, Vol. 6841, 2007, pp. 68410G1-68410G6).

Figure 5:
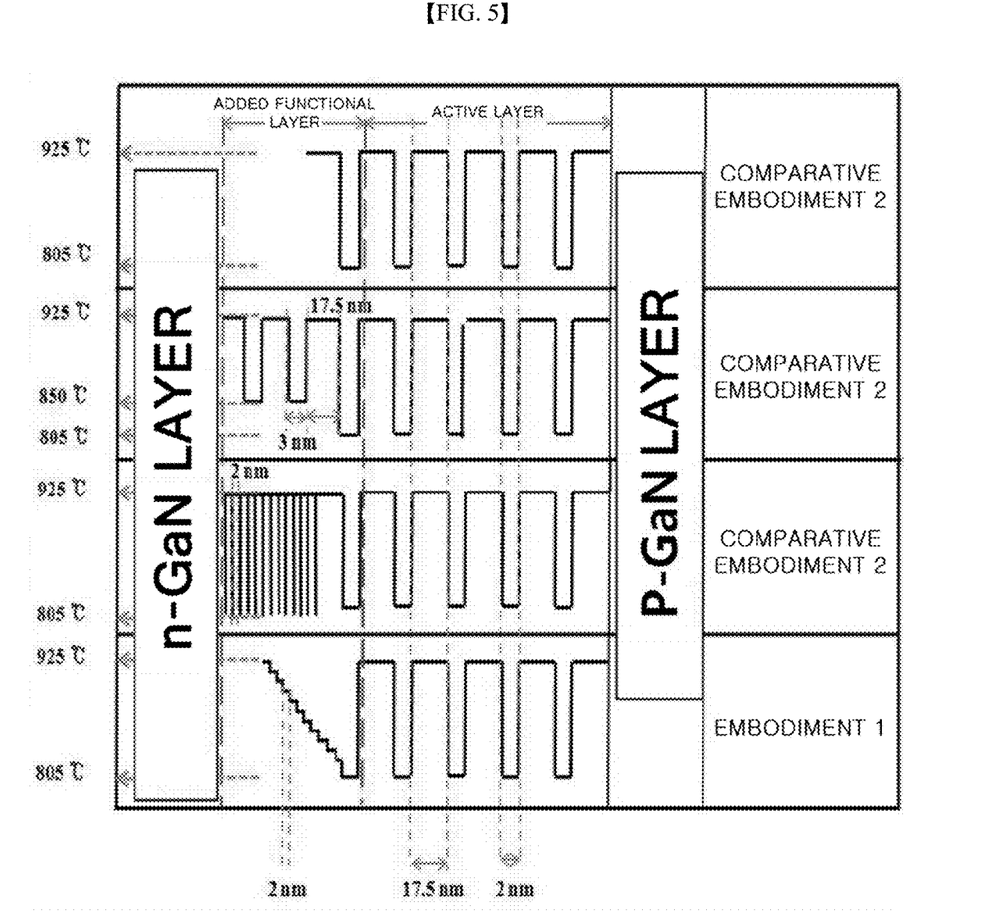
FIG. 5 is a table illustrating change of process temperature during manufacturing a light emitting diode according to Embodiment 1 and Comparative Embodiments 1 to 3 of the present invention.

FIG. 5 is a table illustrating change of process temperature during manufacturing light emitting diodes according to Embodiment 1 and Comparative Embodiments 1 to 3 of the present invention.

Referring to FIG. 5, different from Comparative Embodiment 1 to Comparative Embodiment 3, in Embodiment 1 of the present invention, as the number of repeated performance of the formation of the thin film pairs in which InGaN thin films and GaN thin films of 2 nm are sequentially stacked is increased, a temperature of each step is smaller than that of a previous step by about 5. This is for, as described above, increasing the composition ratio of indium (In) of the InGaN thin film included in the inclined type superlattice thin film layer as getting closer to the active layer.

Figure 6A:
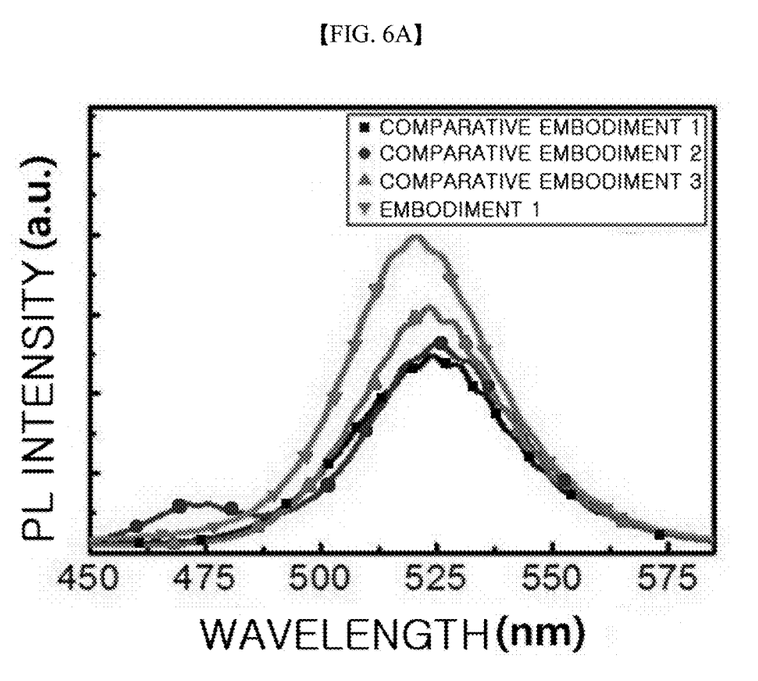
FIGS. 6A and 6B are tables illustrating photoluminescence intensity (PL intensity) according to a change of wavelength and temperature according to Embodiment 1 and Comparative Embodiments 1 to 3 of the present invention.
Figure 6B:
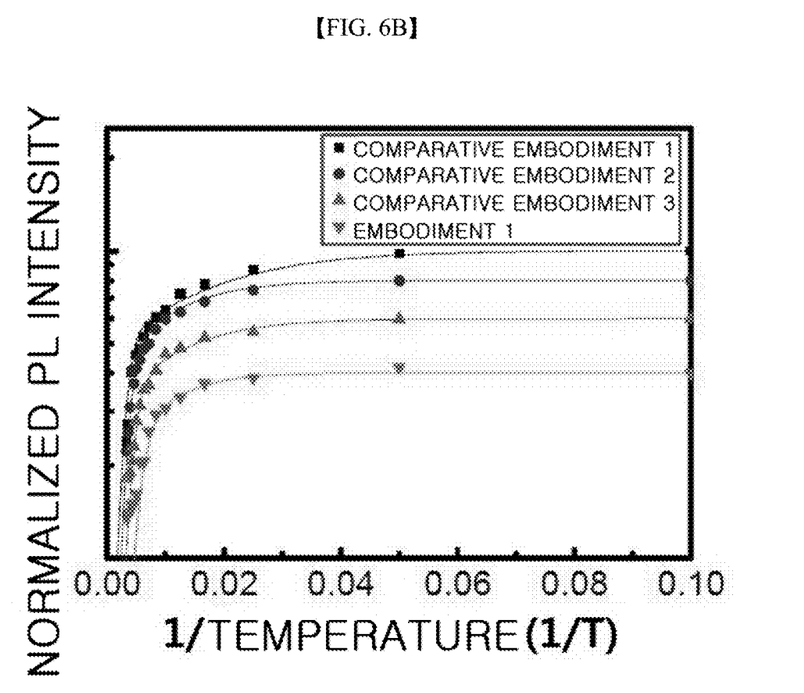

FIGS. 6A and 6B are tables describing photoluminescence intensity (PL intensity) according to a change of wavelength and temperature according to Embodiment 1 and Comparative Embodiments 1 to 3 of the present invention.

Referring to FIG. 6A, light excitation illumination intensity of the light emitting diode of Embodiment 1 of the present invention is increased by about 73.5% compared with Comparative Embodiment 1 to Comparative Embodiment 3. Also, the peak position is blue-shifted by about 2 nm to about 3 nm, and thus, the inclined type superlattice thin film layer of the present invention reduces a strain of the active layer and improves carrier injection efficiency.

Also, FIG. 6B is result of an IQE test, an analysis of defect density, and a measurement of activated energy based on data from low temperature PL equipment at temperatures in a range of about 10K to 300K. This is low temperature PL data fitted using Arrhenius plots to show optical characteristics of activation energy which contributes to non-light-emitting energy and does not contribute to light emission, and the increase of the IQE represents an improvement of the electron-hole overlap wave function in an active layer. Thus, referring to FIG. 6B, the light emitting diode of Embodiment 1 of the present invention is improved by 23.9% to 33.8% compared with Comparative Embodiments 1 to Comparative Embodiment 3. Thus, when the light emitting diode according to embodiments of the present invention includes the inclined type superlattice thin film layer formed under the active layer, quantum confinement effect is increased in the multiple quantum wells of the active layer, the number of carriers that do not contribute to light emission is decreased, and thus, non-light-emission caused by the defects may be greatly decreased. Thus, internal quantum efficiency of the light emitting diode according to embodiments of the present invention may be improved.

Figure 7A:
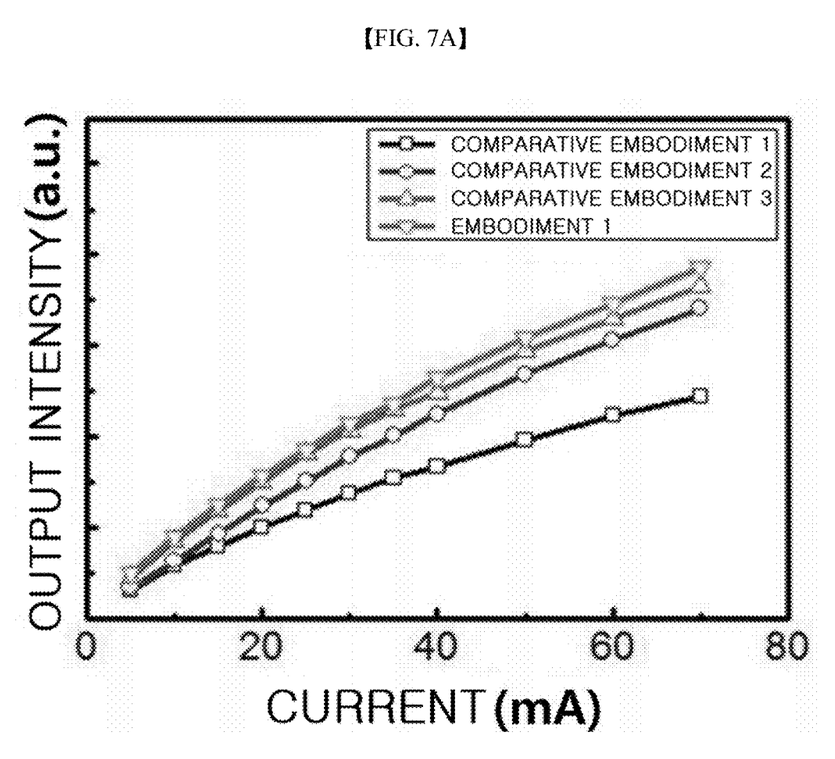
FIGS. 7A and 7B are tables illustrating electrical characteristics according to wavelength according to Embodiment 1 and Comparative Embodiments 1 to 3 of the present invention.
Figure 7B:
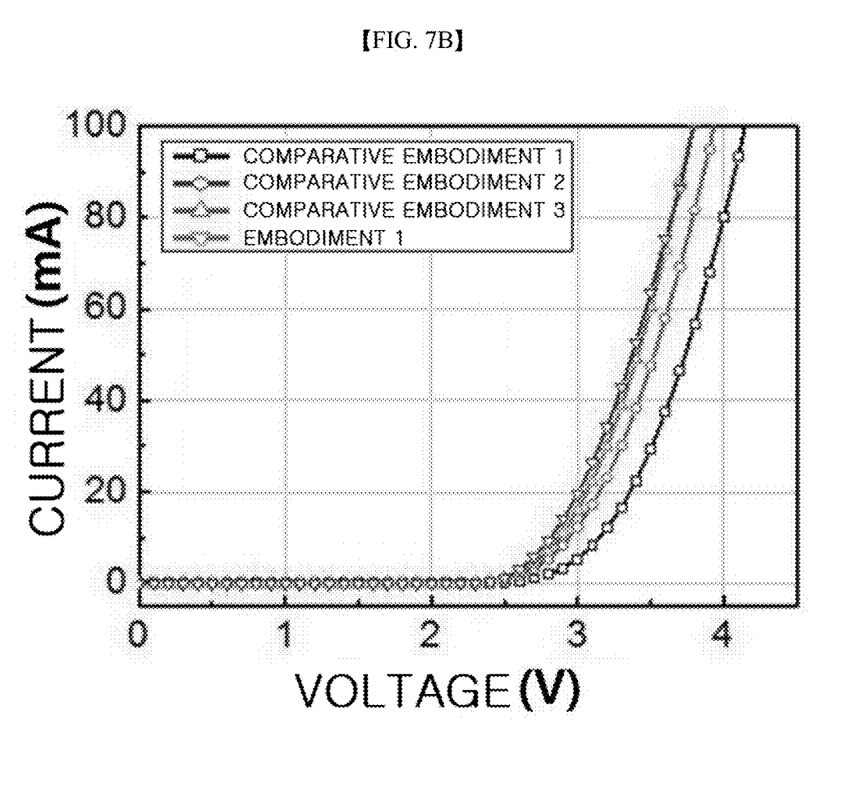

FIGS. 7A and 7B are tables illustrating electrical characteristics according to wavelength according to Embodiment 1 and Comparative Embodiments 1 to 3 of the present invention.

In particular, FIG. 7A represents measured output power of green LED chips in which the light emitting diodes of Embodiment 1 and Comparative Embodiment 1 to Comparative Embodiment 3 are applied, using an integrating sphere. In particular, the measurement values are represented by following Table 1.

TABLE 1

| Classification | Current (mA) | Voltage (V) | Primary Wavelength (nm) | Total Output Power (mW) | Peak Wavelength (nm) | Luminous Flux (lm) |
|---|---|---|---|---|---|---|
| Comparative Embodiment 1 | 20 | 3.1 | 526 | 110 | 524 | 756 |
| Comparative Embodiment 2 | 20 | 3.1 | 525 | 120 | 523 | 801 |
| Comparative Embodiment 3 | 20 | 3.3 | 524 | 143 | 523 | 879 |
| Embodiment 1 | 20 | 3.1 | 523 | 145 | 522 | 994 |

Referring to Table 1 and FIG. 7A, when current of 80 mA is applied, output intensity of the LED chip of Embodiment 1 of the present invention is greatly increased by 42.5% compared with Comparative Embodiment 1 to Comparative Embodiment 3. The above is because the internal quantum efficiency is increased, thus may contribute to reducing the green gap effect.

Also, referring to FIG. 7B, resistance of the light emitting diode of Comparative Embodiment 1 is about 14.7Ω, and resistance of Embodiment 1 of the present invention is about 9.9Ω, and thus, that the series resistance of the light emitting diode including the inclined type superlattice thin film layer according to embodiments of the present invention is greatly decreased can be confirmed. Also, turn-on voltage of the light emitting diode of the Embodiment 1 of the present invention is reduced, and thus, that the current injection characteristic is improved can be seen.

According to the embodiments of the present invention, the light emitting diode includes an inclined type superlattice layer under the active layer, and thus, internal residual strain may be reduced, and confinement effect of carriers may be enhanced, thereby internal quantum efficiency may be improved.

Also, the inclined type superlattice thin film layer may be easily formed through controlling temperature and supplying hydrogen without additional process or equipment, and thus, efficiency of manufacturing the high efficiency light emitting diode may be improved.

It will be apparent to those skilled in the art that various modifications can be made to the above-described embodiments of the present invention without departing from the spirit or scope of the invention. Thus, it is intended that the present invention covers all such modifications provided they come within the scope of the appended claims and their equivalents.

What is claimed is:

1. A method of manufacturing a light emitting diode, comprising:
    forming an n-type semiconductor layer on a substrate;
    forming an inclined type superlattice thin film layer on the n-type semiconductor layer;
    forming an active layer having a quantum well structure on the inclined type superlattice thin film layer; and
    forming a p-type semiconductor layer on the active layer,
    wherein forming the inclined type superlattice thin film layer comprises:
        forming an InGaN thin film,
        subsequently removing indium from an upper portion of the InGaN thin film such that the upper portion turns to a GaN layer while a lower portion of the InGaN thin film becomes an InGaN layer, and
        repeating the steps of forming an InGaN thin film and subsequently removing indium therefrom, wherein repeating the steps forms the inclined type superlattice thin film layer, in which a pair of the GaN layer and the InGaN layer is repeated,
    wherein a compositional ratio of indium varies in the inclined type superlattice thin film layer such that more indium is contained in InGaN layers located closer to the active layer.

2. The method of claim 1, wherein the InGaN is formed using a metal organic chemical vapor deposition (MOCVD) method under nitrogen atmosphere.

3. The method of claim 1, wherein removing indium comprises supplying hydrogen ($H_2$) onto the upper portion of the InGaN thin film.

4. The method of claim 3, wherein hydrogen is supplied for 25 seconds to 30 seconds at a speed in a range of 8,000 seem to 8,500 seem.

5. The method of claim 1, wherein the steps of forming an InGaN thin film and subsequently removing indium therefrom is repeated 2 to 100 times.

6. The method of claim 1, wherein in repeating the steps, multiple ones of forming the InGaN thin film are performed at different temperatures such that a later one of forming the InGaN thin film is performed at a temperature lower than that of an earlier one of forming the InGaN thin film.

7. The method of claim 6, wherein the later one of forming the InGaN thin film is performed at a temperature lower than that of the earlier one by 5° C.

8. The method of claim 1, wherein before forming the active layer of the quantum well structure, the method further comprises forming another GaN layer on the inclined type superlattice thin film layer.

* * * * *